United States Patent [19]

Shirai et al.

[11] Patent Number: 4,695,515
[45] Date of Patent: Sep. 22, 1987

[54] METAL CORED BOARD AND METHOD FOR MANUFACTURING SAME

[75] Inventors: Hideaki Shirai; Kimio Chiba; Koji Okawa; Hiroshi Ishibashi; Akihiro Ishii; Hirotaka Itoh; Hirokazu Kuzushita; Michihiko Yoshioka; Michio Hirose, all of Amagasaki, Japan

[73] Assignee: Dainichi-Nippon Cables, Ltd., Hyogo, Japan

[21] Appl. No.: 759,210

[22] Filed: Jul. 26, 1985

[30] Foreign Application Priority Data

Jul. 30, 1984 [JP] Japan ............................. 59-118195[U]
Jul. 30, 1984 [JP] Japan ............................. 59-118196[U]
Dec. 22, 1984 [JP] Japan ................................. 59-271425
Dec. 22, 1984 [JP] Japan ................................. 59-271426

[51] Int. Cl.⁴ ............................................ B32B 15/08
[52] U.S. Cl. ..................................... 428/458; 428/461; 428/463; 428/469; 428/636; 428/637; 428/638; 428/639; 428/640; 428/671
[58] Field of Search ............... 428/461, 458, 463, 469, 428/472, 636, 637–640, 671

[56] References Cited

U.S. PATENT DOCUMENTS

2,787,561 4/1957 Sanders ............................... 428/379

FOREIGN PATENT DOCUMENTS

51-6143 1/1976 Japan .
51-12673 1/1976 Japan .
51-49468 4/1976 Japan .

*Primary Examiner*—Edith Buffalow
*Attorney, Agent, or Firm*—Armstrong, Nikaido, Marmelstein & Kubovcik

[57] ABSTRACT

It is disclosed that a metal cored board which comprises a base metal core, an easily solderable metal plating layer formed on one surface of the base metal core, an electrically insulating layer formed on the another surface of the base metal core, and an electrically conductive metal layer formed on the electrically insulating layer, a method for manufacturing a metal cored board, which comprises a step to plate both surface of a base metal core with an easily solderable metal, a step to form an electrically insulating layer on one surface of the easily solderable metal plating layer, and a step to form an electrically conductive metal layer on the electrically insulating layer.

6 Claims, 4 Drawing Figures

METAL CORED BOARD AND METHOD FOR MANUFACTURING SAME

BACKGROUND OF THE INVENTION

The present invention relates to a metal cored board and a method for producing the same, which is used suitably for preparing a hybrid integrated circuit.

The recent outstanding trend in the electric and electronic field is to make smaller the size of various devices and apparatus with using a compact hybrid integrated circuit. Under the trend it becomes very important problem to be solved to release efficiently the Joule's heat generated from the circuit. Especially, heat-releasing in the portion mounting a silicon chip and like semiconductive element is more important and urgent, because in general such a semiconductive element is very sensitive to heat and deteriorates or miss-operates possibly at a high temperature surroundings.

The hybrid integrated circuit is mounted usually on a wall or base of an apparatus, and in this mounting hitherto, the metal core of the circuit has been screwed down to the apparatus. The circuit fixed by the method is demountable to be advantageous for repair and inspection. However, this mounting method has a fatal shortcomming, that is, even if tightly screwed, there remains always an air layer of micron order between the metal core and the apparatus. The air layer prevents the Joule's heat from efficient release. In addition, the screw frequently loosens gradually in the course of operating the apparatus, or is loosened by vibration of the apparatus to increase the air gap.

The present inventors discoovered that the metal core is soldered to the apparatus in order to improve thermal conductivity therebetween. The idea, however, is difficult to put it in practice for the following reason. Namely, the metal core is composed in general of aluminium, iron, and like base metals from economical standpoint, and those base metal are difficult to be soldered or requires special techniques for soldering, because of easy oxidizable characteristics thereof.

SUMMARY OF THE INVENTION

An object of the present invention is to provide a metal cored board having a metal core composed of a base metal, which is used suitably for preparing a hybrid integrated circuit.

Another object of the present invention is to provide a metal cored board whose metal core is solderable easily to other electrical parts.

An still another object of the present invention is to provide a method for producing a metal cored board whose metal core is solderable easily to other electrical parts.

More specifically, the present invention provides a metal cored board, which comprises a base metal core, an easily solderable metal plating layer formed on one surface of the base metal core, an electrically insulating layer formed on the another surface of the base metal core, and an electrically conductive metal layer formed on the electrically insulating layer.

Furthermore, the present invention provides a method for producing a metal cored board, which comprises a step to plate both surfaces of a base metal core with an easily solderable metal, a step to form an electrically insulating layer on one surface of the easily solderable metal plating layer, and a step to form an electrically conductive metal layer on the electrically insulating layer.

BRIEF DESCRIPTION OF THE INVENTION

Each of FIGS. 1 to 3 is the sectional view of an embodiment of the present invention.

FIG. 4 is an explanatory figure for explaining an embodiment for producing cotinuously a metal cored board of the present invention.

DETAILED DESCRIPTION OF THE INVENTION

Figure 1:
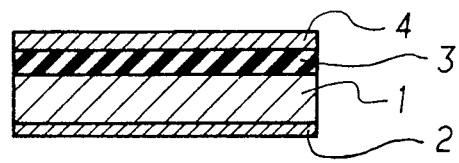
Figure 2:
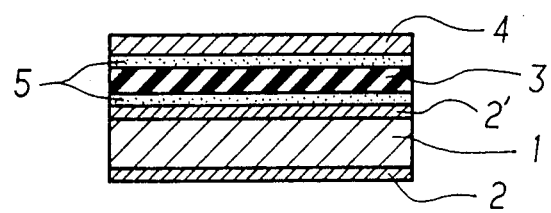
Figure 3:
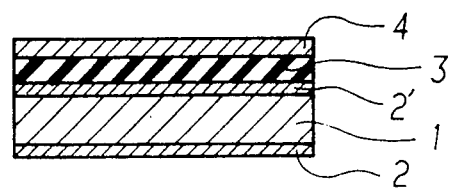

Referring now to FIGS. 1 to 3, a metal core 1 has on one surface thereof a plating layer 2 composed of an easily solderable metal, and also has on the another surface an electrically insulating layer 3 on which there is provided an electrically conductive metal layer 4.

Each embodiment shown in FIGS. 2 and 3 has two easily solderable metal plating layers 2 and 2' formed on each surface of the metal core 1. The electrically insulating layer 3 of FIG. 2 is adhered to the layer 2' and the layer 4 with aid of adhesive layers 5 and 5. The electrically inslating layers 3 in FIGS. 1 and 3 are sandwiched between the layer 1 and 4 in well-adhered state without adhesive layer. The embodiments of FIGS. 1 and 3 can be prepared, for example, by coating electrophoretically the metal core (in FIG. 1) or the layer 2' (in FIG. 3) with an insulating varnish, by semi-curing the electrodeposition layer to make it B stage, by superimposing a foil of an electrically conductive metal on the above semi-cured layer, and by heat-pressing the assembly to complete final curing of the insulating layer and adhesion between the insulating layer and the foil.

In the present invention, the metal core 1 is composed of a base metal, for example, aluminium such as a pure aluminium, a re-used aluminium, an aluminium alloy, ferrous metals such as a pure iron, an iron alloy, steels such as a silicon steel, a stainless steel, and other easily oxidizable metals. Among them, preferable base metals are pure aluminium having a purity of above 95% by weight, preferably above 99% by weight, because of good thermal conducticity thereof, and silicon steels because of good thermal conductivity and magnetic permeability thereof whereby they have an excellent magnetic shielding effect. The thickness of the metal core 1 is, for example, 0.5 to 5 mm, though the value depends upon usage of the metal core.

The metal plating layer 2 is composed of a metal which is solderable easily with a soft solder, that is a solder having a melting point of lower than 300° C., such as common solder, plumber's solder, tinsmith solder, and the like. Examples of the metal of the layer 2 are noble metals such as copper, silver, gold, a member of the platinum group, nickel, tin, lead, a member of the above-mentioned soft solders, and other hardly oxidizable metal having a melting point of at least 100° C.

The formation of the layer 2 on the metal core 1 can be realized, for example, by carrying out the following steps, that is, removing the oxide layer on the surface of the metal core 1 by polishing mechanically or dissolving chemically, then treating with a zincate solution, and finaly plating an above-mentioned metal electrically or chemically. The layer 2 may also be formed by the manner that cuprous chloride and like reducable metal salt is applied on the metal core 1, thenafter heated so as to take place reduction of the oxide on the metal core 1 and formation of the plating layer 2 simultaneously.

The thickness of the plating layer 2 is, for example, from 0.05 to 10 μm.

The embodiment shown in FIG. 1 can be produced with a metal core 1 having only on one surface thereof a metal plating layer 2, which is produced, for example, by metal-plating a metal strip whose one surface is masked with a polyvinylchloride visco-adhesive tape. Such a single-side plated metal core, however, is troublesome for producing and therefore costly. On the contrary, a both-side plated metal core is easy to produce because of using no masking tape, and therefore advantageous on cost. Furthermore, the above metal core makes it easy to form an electrically insulating layer having an excellent resistance against peeling from the following reason, and so the examples shown in FIGS. 2 and 3 are preferable in the present invention.

Namely, there is always an oxide layer on the metal core 1 of a base metal, as described before, and the oxide layer prevents the formation of the insulating layer having excellent peeling strength, especially in the case of electrophoretical deposition for forming the insulating layer.

On the contrary, it is possible to form an electrically insulating layer having an excellent peeling strength on the plating layer of a metal described above, especially copper, by electrophoretical deposition or other method.

Even if the layer 3 is formed in any way, a metal layer which comes in contact directly or through the adhesive layer 5 with the layer 3, such as the layers 1, and 4 in FIG. 1, the layers 2, and 4 in FIG. 2, and the layers 2' and 4 in FIG. 3 etc. has preferably a surface roughness $R_{max}$, as defined in JIS B 0601, of from 0.1 to 10 μm in order to further improve the peeling strength of the layer 3.

The insulation layer 3 may be composed of an electrically insulating organic polymer, such as polyamide, polyimide, polyamideimide, polyvinylformal, polyurethane, polyester, polysulphone, poly-ether-ether-ketone, and the like, and may be formed by extrusion, adhesion of a casting film of a polymer and the like. The layer 3 is formed preferably by repeated coatings and bakings or electrophoretical coating and baking on the layer 1, 2', or 4 using an insulating varnish so as to make substantialy no pinhole in the layer.

As the varnishes, those which are used in the manufacturing of magnet wires may be employed, such as electrodeposition varnishs, mechanical coating varnishs.

Anionic varnishes and cationic varnishes of dispersion type or solution type using water or a mixture of water and an organic solvent as a dispersant or solvent may be used as an electrodeposition coating varnish in the present invention.

Preferable examples of the electrodeposition coating varnish are a copolymer of (a) at least one compound (hereinafter, designated the a-component for brevity) represented by the formula (I):

and (b) at least one compound (hereinafter, the b-component) of the formula (II):

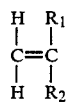

and (c) an unsaturated organic acid (hereinafter, the c-component) having 3 to about 30 carbon atoms and at least one double bond which is reactable with the double bond of the a-component or b-component.

In the formula (I) or (II), $R_1$ represents hydrogen atom and an alkyl group having 1 to 30 carbon atoms, such as methyl, ethyl, propyl and the like, $R_2$ represents a cyano group, an aldehyde group and a carboxyalkyl ester group having 2 to about 30 carbon atoms, such as carboxymethyl ester, carboxyethyl ester, carboxypropyl ester, carboxybutyl ester and the like, $R_3$ and $R_4$ each represents a hydrogen atom, an amide group, a glycidyl ester group, glycidyl ether group and an organic group having 1 to about 30 carbon atoms selected from the group consisting of an alkyl group, such as methyl, ethyl, propyl, butyl and the like, an N-alkylamide group, such as N-methylamide, N-ethylamide, N-propylamide and the like, and an alkylol group, such as methylol, ethylol, propylol and the like, except that both $R_3$ and $R_4$ are not simultaneously a hydrogen atom or an alkyl group. When the number of carbon atoms of the above c-component and the $R_1$, $R_2$, $R_3$, or $R_4$ organic groups exceed about 30, the heat resitance of the resulting polyacryl resin tends to decrease and, therefore, the maximum number of carbon atoms of the c-component and the above $R_1$, $R_2$, $R_3$, or $R_4$ organic groups preferably does not exceed about 20.

Examples of the c-component are monobasic unsaturated acids, such as acrylic, crotonic, vinylacetic acid, methacrylic, tiglic, α-ethylacrylic, β-methylcrotonic, 2-pentenoic, 2-hexenoic, 2-heptenoic, 2-octenoic, 10-undecenoic, 9-octadecenoic, cinnamic, atropic, α-benzylacrylic, methyl atropic, 2,4-pentadienoic, 2,4-hexadienoic, 2,4-dodecadienoic acid, 9,12-octadecadienoic acid, dibasic unsaturated acids, such as maleic, fumaric, itaconic, citraconic, mesaconic, glutaconic, dihydromuconic, muconic, and tribasic unsaturated acids, such as 1,2,4-tricarboxylic butene and the like.

The polyacryl resin used in the present invention can be prepared by the well-known polymerization procedures such as an emulsion polymerization, a solution polymerization, a suspension polymerization and the like as described, for example, in U.S. Pat. Nos. 2,787,561 and 3,509,033, and in "Acryl Resin" by Kou Asami, published by Nikkan Kogyo shinbun, Tokyo, 1970, p. 25 to p. 27, using about 1 to 20 moles, preferably about 2 to 10 moles, or most preferably about 4 to 6 moles, of the a-component per one mole of the b-component and about 0.01 to 0.2 mole, preferably about 0.03 to 0.1 mole of the c-component per one mole of the a- and b-components, i.e., per mole of the sum of the moles of the a-component and the b-component.

Among the above described a-, b-, and c-components, more preferred examples are those components in which the total number of carbon atoms is less than 15 from the standpoint of the heat resistance of the polyacryl resin obtained. More preferred examples of the a-component are acrylonitrile, metharylonitrile, methylacrylate, ethylacrylate, propylacrylate, butylacrylate, methylmethacrylate, ethymethacrylate, proptlmethacrylate, and acrolen. More preferred examples of the b-component are glycidylacrylate, glycidylmethacrylate, allylglycidylether, acrylamide, methylolacrylamide, and ethylolacrylamide. More preferred examples of the c-component are acrylic acid, methacrylic acid, α-ethylacrylic acid, crotonic acid, maleic acid, and fumaric acid.

The polyacryl resin employed in the present invention may also be those modified with one or more of styrene and its derivatives or diolefins. As the derivatives of styrene, there are employed those compounds in which the phenyl group of styrene is substitited with at least one group selected from the group consisting of a cyano group, a nitro group, a hydroxy group, an amine group, a vinyl group, a phenyl group, a halogen atom such as chlorine, bromine, etc., an organic group having 1 to 20 carbon atoms, such as an alkyl group, an aralkyl group, an N-alkylamine group. Examples of the above alkyl group are methyl, ethyl, propyl, butyl, etc., and examples of the above aralkyl groups are benzyl, α- or β-phenylethyl, etc., and examples of the above N-alkylamine groups are N-methylamine, N-ethylamine, N-propylamine, etc. Among the styrene derivatives, those which have 1 to 3 substituent groups are preferable because of their ready reactivity with the a- to c-components. Preferable examples are methyl styrenes, ethyl styrenes, divinyl benzenes, chlorostyrenes. As the diolefins as a modifying agent, those compounds are used whose total number of carbon atoms is 3 to about 20, preferably 4 to about 10. Examples of the above diolefins are the butadienes, pentadienes, methyl-butadienes and the like.

Polyacryl resins modified with those modifying agents can be prepared using well-known polymerization methods previously described using starting material mixture containing one or more of the above modifying materials in addition to a-, b-, and c-components. However, the amount of styrene and its derivatives or diolefins restricted preferably to about 2 moles or one mole or less, respectively, per one mole of the a-component.

In the present invention, a polyacryl resin (including the modified resin) having preferably a degree of polymerization of approximately about 10,000 to about 1,000,000 is used, since a polyacryl resin having too low a degree of polymerization is lacking in toughness, and in turn a polyacryl resin having too high a degree of polymerization tends to result in a somewhat uneven coating surface due to a poor fluidity of the resin in the uncured state. Therefore, more preferably polyacryl resins are those having a degree of polymerization of about 100,000 to about 500,000.

The polyacryl resin employable in this invention prepared by any one of the prior art processes can be coated in the form of a dispersion or a solution in water or in an appropriate organic solvent such as N-methyl-2-pyrrolidone, N,N-dimethylformamide, N,N-dimethylacetamide, dimethylsulfoxide and the like using a polymer concentration of about 5 to about 50, preferably about 10 to about 30% by weight and subsequently the coating can be baked at a temperature ranging from about 100° C. to about 600° C., preferably about 200° C. to 500° C., whereby a tough insulating layer can be formed on the copper plating layer by baking.

The insulating layer 3, when formed by coating and baking an insulating varnish, has substantially no pinholes as mentioned afore, and therefore has an excellent dielectric breakdown strength. This makes it possible to adopt a thinner insulating layer and furthermore, the adoption of a thinner organic polymer layer is in general advantageous for thermal conductivity of the layer, and therefore to produce a metal cored board which is excellent in heat release. The thickness of the insulating layer 3 is, for example, from 20 to 100 μm, preferably from 30 to 50μm.

In the present invention the insulating layer 3 may include a thermally conductive filler in order to improve its thermal conductivity. Such an insulating layer 3 can be formed by using a varnish including a thermally conductive filler, such as alumina, boron nitride, silicon nitride, aluminium nitride, magnesia, beryllia, fluorite, and the like. The thermally conductive filler is in particle size, for example, from 0.1 to 20 μm, preferably from 0.5 to 5 μm from the standpoint of obtaining even dispersion thereof in the varnish. The amount of the filler in the varnish is, for example, from 0.5 to 30 parts by weight, preferably from 1 to 10 parts by weight per 100 parts by weight of the resin included in the varnish from the standpoint of compatibility in thermal conductivity and electrical insulating property of the insulating layer 3.

The conductive layer 4 is composed of an electrically conductive metal, such as copper, nickel, aluminium, silver, gold, and the like metal having a volume resistivity at 25° C. of, for example, lower than $10 \times 10^{-6}$ ohm.cm., preferably lower than $5 \times 10^{-6}$ ohm.cm. A complex foil comprising at least two conductive metal layers, for example, a foil of aluminium whose one or both surfaces have copper layer or layers, is also preferable as a material of the conductive layer 4.

Though various chemical kinds of adhesives may be used in the adhesive layer 5, preferable those which are heat-resistant. Examples of the adhesive are epoxy types such as EPOX-AH-333 from Mitsui petrochemical Co. Ltd, silicon types such as YR-3286 from Toshiba Silicon Co. Ltd, epoxy.nylon types such as AF-42 from Minesota Mining and Manufacturing Co. Ltd, imide types such as BT resin base adhesive from Mitsubishi Gas Chemical Co. Ltd, RAMDITE from Denki chemical Co. Ltd, and the like.

Figure 4:
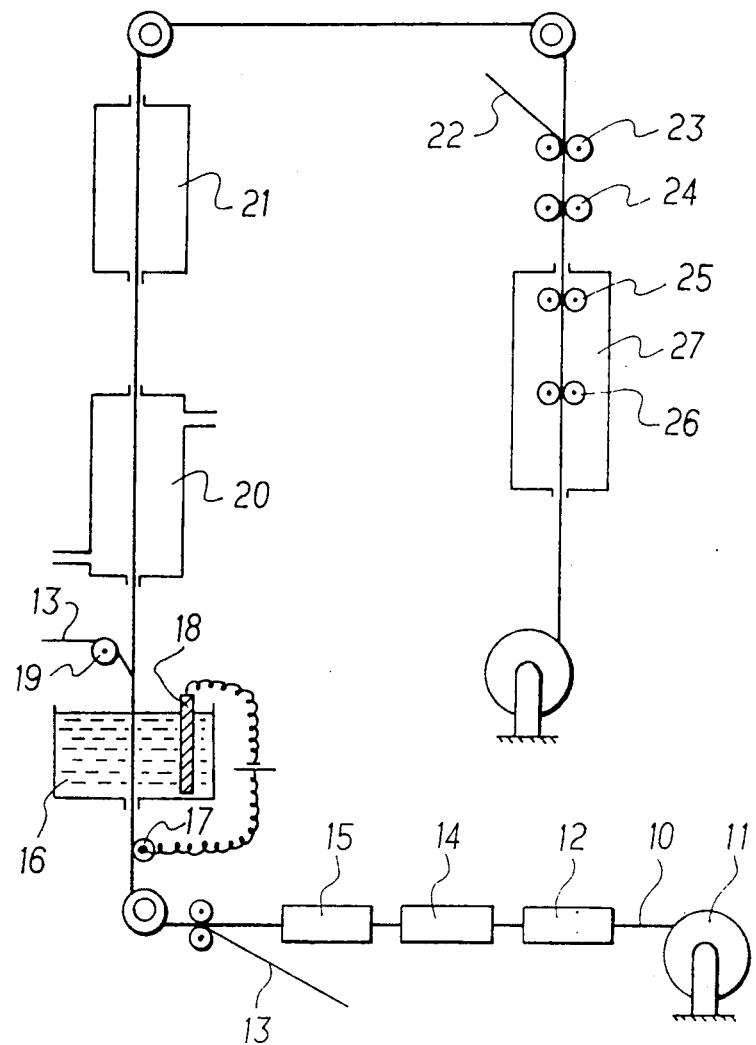

Refering now in FIG. 4 an embidiment of the method for producing an aluminium cored board, as an embodiment of the metal cored board, of the present invention is explained.

The surface of an aluminium strip 10 which becomes an aluminium core and is taken off continuously from a drum 11 as cleaned at a cleaning means 12.

Though the cleaning does not always necessarily, it is preferable to remove dust, fat and oil, and aluminium oxide on the surface of the aluminium strip. Fat and oil can be removed by washing using an organic solvent, such as trichloroethylene. On the other hand, aluminium oxide layer can be removed by treating with an aqueous solution of a caustic alkali, such as caustic soda.

The aluminium strip whose surface is cleaned, washed, and dried, and primed at a priming means 14. The step of the priming is effective for forming a copper plating layer bonded tightly on the surface of the aluminium strip 10.

Preferable examples of the primer materials are zinc, tin, and the like, especially zinc. Zinc plating can be carried out by well-known zincate treatment with an aqueous solution which can form a zinc layer on the surface of the aluminium strip. Examples of the aqueous solution are a solution of a chmical compound of zinc such as zinc oxide, and a caustic alkali such as caustic soda, especially an aqueous solution comprising 200-600 g/l of caustic soda, 20-200 g/l of zinc oxide, 0.5-20 g/l of ferric chloride, 1-100 g/l of potassium tartrate, and 0.5-20 g/l of sodium nitrate. Bondal solution and like commercially available zincate solutions may also be used preferably.

The zincate treatment may be conducted at an arbitrary temperature. However, treatment at too low temperature requires long times for the formation of zinc layer, on the other hand, treatment at too high temperature tends to fail in formation of zinc layer which bonds tightly on the surface of the aluminium strip, and therefore the treatment is conducted preferably at a temperature of from 20° to 65° C., more preferably, from 25 to 55° C., and a treatment time of from 1 to 60 seconds, more preferably, from 3 to 30 seconds.

Plating of copper onto the primer layer is carried out at a copper plating means 15, and may be carried out not only by electroplating but also be electrodeless plating. In the present invention it is not absolutely necessary to form too thick copper plating layer, and as already described, a very thin copper plating layer, such as from 0.5 to 10 μm, is usually effective. Thus, the aluminium strip 10 is plated with copper on both surfases thereof.

Thenafter, one surface of the aluminium strip 10 is masked with a masking tape, such as polyvinylchloride visco-adhesive tape, and the another surface of the strip is covered with an insulating layer which is formed by coating an insulating varnish by electrophoretical, mechanical, or like other methods, and by baking the coated layer in conventional manner. In the case of electrophoretical coating it is carried out in a bath 16. An electrodeposition layer is formed on the copper plating layer by applying voltage between a rolling pole 17 which is brought into contact with the aluminium strip 10 and an opposite pole 18 which is located in the bath 16.

The general conditions in the electrodeposition are from 1 to 60 V in voltage to be applied, from 0.5 to 10 mA/cm$^2$ in current density, from 1 to 60 seconds in retention time in the bath, and from 10 to 25% by weight in concentration of resin in an electrodeposition varnish. The copper plating layer formed at the means 15 may be coated without any treatment. However, in order to improve the peeling strenght of the electrodeposition layer it is preferable to roughen evenly the surface of the copper plating layer with aid of a suitable grinding means, such as sand paper, sand blast, a grinding roll and the like, in advance of electrodeposotion.

In the present invention a variety of electrodeposition varnishes may be used as mentioned already. Among them, anionic varnishes are preferable from the view point of realizing an electrical insulating layer which is excellent in thermal conductivity for the following reason. Namely, in the case where an anionic varnish is used, the copper plating layer to be coated is made the anode. As a result, a part of copper in the copper plating layer dissolves in the varnish in the course of the electrodeposition to form an organic polymer layer containing copper. The copper improves the thermal conductivity of the layer. A care must be taken, however, about the fact that too much amount of the copper lowers the dielectric breakdown strength of the layer, and therefore it is necessary to control the amount. Preferable amount thereof is from 0.1 to 1% by weight. From the above viewpoint, preferable conditions of electrophoretic deposition are from 15 to 25 V in voltage and from 0.9 to 5 mA/cm$^2$ in current density.

After the deposition, the masking tape 13 is removed through a roll 19, and the electrodeposition layer is subjected to a treatment at a chamber 20. Though this treatment is not absolutely necessary in the present invention, it is recommendable from the reason that the treatment accelerates coagulation of resin particles in the electrodeposition layer to improve its dielectric breakdown strength. In this treatment the layer is brought into contact with an organic solvent or a high temperature steam of about from 300° to 600° C. for from about 1 to 60 seconds, preferably about 3 to 30 seconds.

Organic solvents which are capable of at least swelling the electrodeposition layer and dissolving water are preferable. Examples of such organic solvent are monohydric or polyhydric alcohols such as methanol, ethanol, propanol, ethylene glycol, glycerine and the like, cellosolves such as ethylene glycol monomethyl ether, ethylene glycol monoethyl ether, ethylene glycol isopropyl ether, ethylene glycol monobutyl ether, ethylene glycol diethyl ether, ethylene glycol dibutyl ether, ethylene glycol monophenyl ether and the like, nitrogen-containing organic solvents such as N,N-dimethylformamide, N,N-dimethylacetamide, N-2-methylpyrrolidone and the like, sulfur-containing organic solvents such as dimethylsulfoxide, etc. In particular, N,N-dimethylformamide, N,N-dimethylacetamide, N-2-methylpyrrolidone and dimethylsulfoxide are preferred.

When an organic solvent is used, the layer is treated with the solvent of room temperature or a high temperature above its boiling in the state of vapor, liquid, or mist, preferably with the solvent in the state of mist at a temperature of from room temperature to 100° C.

The electrodeposition layer thus treated is then heated at a preheating furnace 21 to be made semicured state (B stage). Such a semicure is achieved, for example, by heating at a temperature of from ⅓ to 3/5 of the temperature for final curing or baking for from about 5 to 120 seconds.

A foil 22 of an electrically conductive metal, such as copper, having an adhesive layer on its one surface is applied on the semicured electrodeposition layer in the condition that the adhesive layer is faced to the semicured layer. While the aluminium strip 10 with the foil 22 applied thereon passes through a main heating furnace 27 having compression rolls 25, 26, . . . therein via compression rolls 23, and 24, the electrodeposition layer and adhesive layer are heated to a temperature of, for example, 150° to 300° C., for 20 to 40 minutes. By this heating final baking and adhesion are achieved simultaneously.

Oxidation of the foil and deterioration of the organic layers, if any, can be solved by filling the furnaces 21 and 27 with an inert gas such as nitrogen, argon and the like.

In the modified example of the embodiment shown in FIG. 4 the electrodeposition layer is baked completely at the preheating furnace 21, and only a heating necessary for adhesion is applied at the furnace 27.

In another embodiment of the present invention a strip of silicon steel or other base metals instead of the aluminium strip 10, and a plating layer of nickel or other easily solderable metals instead of the copper plating layer may be adopted, respectively.

The following examples illustrates in greater detail the metal cored board of the present invention and the method for manufacturing the same, but they are not to be construed as limiting the scope of the present inven-

EXAMPLE 1

An aluminium plate having a thickness of 1 mm is treated with an aqueous solution of caustic soda to remove aluminium oxide on the surface, treated with an aqueous zincate solution consisting of 400 g/l of caustic soda, 100 g/l of zinc oxide, 1 g/l of ferric chloride, 5 g/l of potassium tartrate, and 5 g/l of sodium nitrate at a temperature of 30° C. for 30 seconds to form zinc plating, and washed. Copper plating layer 20 $\mu$m in thickness is then formed on the zinc plating by electrodeposition, washed and dried. Thus, an aluminium plate having layers of zinc and copper is formed.

One of the copper plating layers is masked with a polyvinylchloride visco-adhesive tape, and the another copper plating layer is roughened well by sand paper of No. 200, coated electrophoretically with a water dispersion varnish of epoxy-acryl (V-551-20 from Ryoden Kasei Co., Ltd, concentration of resin: 20%) to form an electrodeposition layer thereon under the conditions of 30° C. in the varnish temperature, 1.8 mA/cm$^2$ in current density, 45 seconds in retention time, 100 mm in distance between two poles, and the copper plating layer being the anode.

The electrodeposition layer 40 $\mu$m in thickness is treated with N,N-dimethylformamide at a temperature of 30° C. for 10 seconds and, after removing the masking tape, the layer is subjected to primary cure by heating at a temperature of 150° C. for 30 minutes. The primary cured (B stage) electrodeposition layer is then adhered to a copper film of 35 $\mu$m with an adhesive film (Pyralux LF-0100, 25 $\mu$m in thickness, from Du Pont Co., Ltd) by heat-pressing at 200° C., for 40 minutes and under a pressuer of 20 kg/cm$^2$. Thus, an aluminium cored board is prepared, which is about 1.1 mm in thickness and has the copper plating layer on the rear surface of the aluminium core.

COMPARATIVE EXAMPLE 1

A production similar to that of Example 1 was duplicated with the exception that in advance of the copper plating, one surface of an aluminium plate was masked with a masking tape, and thus an aluminium cored board having no copper plating layer on the rear surface of the aluminium core was obtained.

Measurement of thermal contact-resistance: the aluminium cored board of Example 1 was soldered to a copper plate 2 mm in thickness with a conventional solder, while the aluminium cored board of Comparative Example 1 was screwed down to another copper plate of 2 mm thick. The thermal resistance between the aluminium core and the copper plate in Example 1 was 0.006° C/W, and that in Comparative Example 1 was 0.6° C/W.

EXAMPLES 2 TO 6

An aluminium cored board was produced in the same manner as in Example 1, except that instead of the varnish used in Example 1, a varnish described below was used in each Example, respectively, that is, varnish-A in Example 2, varnish-B in Example 3, varnish-C in Example 4, varnish-D in Example 5, and varnish-E in Example 6.

Varnish-A;

A monomer mixture consisting of 5 moles of acrylonitrile, 1 mole of acrylic acid, 0.3 mole of glycidylmethacrylate, 760 g of deionized water, 7.5 g of sodium lauryl sulfate, and 0.13 g of sodium persulfate were charged into a flask, and stirred under a nitrogen stream at room temperature for 15 to 30 minutes. Thereafter the mixture was reacted at a temperature of 50° to 60° C. for a period of 4 hours to obtain an acryl varnish as an aqueous desperaion.

Varnish-B;

The acryl varnish was prepared in the same manner as described in the preparation of Varnish-A but using a monomer mixture consisting of 5 moles of acrolein, 1 mole of methacrylic acid and 0.3 mole of acrylic amide in place of the monomer mixture of Varnish-A.

Varnish-C;

The acryl varnish was prepared in the same manner as described in the preparation of Varnish-A but using a monomer mixture consisting of 5 moles of ethylacrylate, 1 mole of acrylic acid, 0.3 mole of methylol acrylamide, 1200 g of deionized water, 12 g of sodium lauryl sulfate and 0.2 of sodium persulfate.

Varnish-D;

The acryl varnish was prepared in the same manner as described in the preparation of Varnish-A but using 5 moles of acrylinitrile, 1 mole of maleic acid, 0.3 mole of glycidyl methyacrylate, 840 g of deionized water, 8 g of sodium lauryl sulfate and 0.15 g of sodium persulfate.

Varnish-E;

The acryl varnish was prepared in the same manner as described in the preparation of Varnish-A but using 5 moles of acrylonitrile, 1 mole of acrylic acid, 0.3 mole of glycidyl methacrylate, 2 moles of styrene, 1200 g of deionized water, 12 g of sodium lauryl sulfate and 0.2 g of sodium persulfate.

The peeling strength between the aluminium plate (core) and the baked organic polymer layer was measured by 90 degree peeling at room temperature about 10 specimens taken from each of Examples and Comparative Examples. Two series of measurements were conduted, that is, 5 specimens were measured without heating (initial value), and other 5 specimens were measured after heating at 200° C. for 60 minutes. The results were shown below with the average value of the 5 specimens.

Example 1 (initial: 2.0 kg/cm, after heating: 1.(kg/cm), Example 2 (initial: 1.9 kg/cm, after heating: 1.7 kg/cm), Example 3 (initial: 2.1 kg/cm, after heating: 1.8 kg/cm), Example 4 (initial: 2.0 kg/cm, after heating: 1.7 kg/cm), Example 5 (initial: 1.9 kg/cm, after heating: 1.7 kg/cm), Example 6 (initial: 1.8 kg/cm, after heating: 1.8 kg/cm).

EXAMPLE 7

A glass cloth 90 $\mu$m in thickness is impregnated with an expoxy resin consisting of 10 parts of EPYCOTE 828 ®, 20 parts of diamino diphenyl methane, and 1 part of BF-400 ®, and the epoxy resin is cured to B stage. The glass cloth is sandwiched between an aluminium plate 1.0 mm in thickness having a layer of a common solder (20 $\mu$m thick) on both surface and a copper foil 35 $\mu$m in thickness. The assembly is then heat-pressed to obtain an aluminium cored board having glass.epoxy insulating layer 100 $\mu$m in thickness.

EXAMPLE 8

An aluminium cored board having an polyimide insulating layer 60 $\mu$m in thickness is produced in the same manner as in Example 7, except that a polyimide film 50 $\mu$m in thickness having a layer of adhesive (EPOX AH-333 ® from Mitsui Petrochemical Co., Ltd) on both surface is used instead of the glass-epoxy resin.

EXAMPLE 9

An aluminium cored board having an insulating layer 40 μm in thickness is produced in the same manner as in Example 1, except that it is used a varnish consisting of 100 parts of the varnish used in Example 1 and 20 parts of aluminium powder about 1 μm in particle size.

About the specimens taken from Examples 1, 6, 7, 8, and 9 are subjected to the following two measurements. Dielectric breakdown voltage (abbreviated to DBV): according to JIS C 2110, and Heat resistance (abbreviated to HR): the transitional heat resistance is measured by means of a power transistor TO-220 soldered on the reverse surface of the aluminium core. The results were shown below. The values shown are average of 5 data.

Example 1 (DBV: 9.5 kV, HR: 2.2° C/W), Example 7 (DBV: 8.9 kV, HR: 2.3° C/W), Example 8 (DEV: 8.0 kV, HR: 1.2° C/W), Comparative Example 3 (DBV: 5.2 kV, HR: 4.8° C/W), and Comparative Example 4 (DBV: 10.0 kv, HR: 3.7° C/W).

What is claimed is:

1. A metal cored board which comprises a base metal core, an easily solderable metal plating layer formed on one surface of the base metal core, an electrically insulating layer formed on the other surface of the base metal core, and an electrically conductive metal layer formed on the electrically insulating layer.

2. A metal cored board of claim 1, wherein the base metal is at least one member selected from the group consisting of aluminum, iron, steel and alloys thereof.

3. A metal cored board of claim 1, wherein the easily solderable metal plating layer is solderable with a soft solder having a melting point of lower than 300° C.

4. A metal cored board of claim 3, wherein the easily solderable metal plating layer is composed of at least one member selected from the group consisting of copper, silver, gold, nickel, tin, lead, and a soft solder.

5. A method for manufacturing a metal cored board, which comprises a step to plate both surfaces of a base metal core with an easily solderable metal, a step to form an electrically insulating layer on one surface of the easily solderable metal plating layer, and a step to form an electrically conductive metal layer on the electrically insulating layer.

6. A method of claim 5, wherein the electrically insulating layer is formed by coating the easily solderable metal plating layer with an electrically insulating varnish and by baking the coated varnish layer.

* * * * *